(12) United States Patent
Alijabbari et al.

(10) Patent No.: US 10,283,363 B2
(45) Date of Patent: May 7, 2019

(54) QUASI-VERTICAL DIODE WITH INTEGRATED OHMIC CONTACT BASE AND RELATED METHOD THEREOF

(71) Applicant: UNIVERSITY OF VIRGINIA, Charlottesville, VA (US)

(72) Inventors: Naser Alijabbari, Elkridge, MD (US); Robert M. Weikle, II, Crozet, VA (US); Matthew Bauwens, Chesapeake, VA (US)

(73) Assignee: UNIVERSITY OF VIRGINIA PATENT FOUNDATION, Charlottesville, VA (US)

( * ) Notice: Subject to any disclaimer, the term of this patent is extended or adjusted under 35 U.S.C. 154(b) by 0 days.

(21) Appl. No.: 15/507,637

(22) PCT Filed: Aug. 28, 2015

(86) PCT No.: PCT/US2015/047590
§ 371 (c)(1),
(2) Date: Feb. 28, 2017

(87) PCT Pub. No.: WO2016/033557
PCT Pub. Date: Mar. 3, 2016

(65) Prior Publication Data
US 2017/0250083 A1  Aug. 31, 2017

Related U.S. Application Data

(60) Provisional application No. 62/043,772, filed on Aug. 29, 2014.

(51) Int. Cl.
*H01L 29/47* (2006.01)
*H01L 21/18* (2006.01)
(Continued)

(52) U.S. Cl.
CPC ............ *H01L 21/185* (2013.01); *H01L 23/48* (2013.01); *H01L 29/20* (2013.01);
(Continued)

(58) Field of Classification Search
CPC ........ H01L 21/185; H01L 23/48; H01L 29/20
See application file for complete search history.

(56) References Cited

U.S. PATENT DOCUMENTS

| 7,906,847 | B2 | 3/2011 | Ohtani et al. |
| 8,013,414 | B2 | 9/2011 | Zhu |

(Continued)

OTHER PUBLICATIONS

Simon et al., "Planar THz Schottky Diode Based on a Quasi Vertical Diode Structure", Fourth International Symposium on Space Terahertz Technology, Apr. 1993 (Apr. 1993); Figure 2, 4-6; p. 394, 398, 399.*

(Continued)

*Primary Examiner* — Marc Anthony Armand
*Assistant Examiner* — Sarah Salerno
(74) *Attorney, Agent, or Firm* — Westerman, Hattori, Daniels & Adrian, LLP

(57) ABSTRACT

A quasi-vertical Schottky diode architecture includes a top-side anode contact that connects to external circuitry through an airbridge finger, a thin mesa of semiconductor material with epilayers including a bottomside highly-doped layer, a bottomside ohmic contact directly below the anode, and a host substrate onto which the diode material is bonded by a thin adhesive layer. A method of fabricating the diode architecture includes preparation of the semiconductor wafer for processing (including initial etching to expose the highly-doped epilayer, deposition of metals and annealing to form the ohmic contact, application of the adhesive layer to the host substrate, thermal compression bonding of diode wafer and host wafer, with ohmic contact side facing host wafer to form a composite wafer, etching and formation of (Continued)

diode mesas to isolate devices on the host substrate, lithography and formation of topside anode contact and external circuitry on host wafer).

9 Claims, 9 Drawing Sheets

(51) Int. Cl.
  H01L 29/872 (2006.01)
  H01L 23/48 (2006.01)
  H01L 29/66 (2006.01)
  H01L 29/20 (2006.01)

(52) U.S. Cl.
  CPC ...... *H01L 29/66212* (2013.01); *H01L 29/872* (2013.01); *H01L 2224/18* (2013.01); *H01L 2224/24* (2013.01); *H01L 2224/24226* (2013.01); *H01L 2224/73267* (2013.01); *H01L 2224/82* (2013.01); *H01L 2224/92244* (2013.01)

(56) References Cited

U.S. PATENT DOCUMENTS

| | | | |
|---|---|---|---|
| 8,114,754 B2 | 2/2012 | Letertre | |
| 8,395,191 B2 | 3/2013 | Or-Bach et al. | |
| 8,581,359 B2 | 11/2013 | Horii et al. | |
| 2003/0122141 A1* | 7/2003 | Wong | H01L 21/2007 257/88 |
| 2003/0231683 A1* | 12/2003 | Chua | B82Y 20/00 372/46.01 |

OTHER PUBLICATIONS

Alijabbari, N., "Submillimeter-Wave Quasi-Vertical GaAs Schottky Diodes Integrated on Silicon Membranes" (2014).
W.L. Bishop, K. McKinney, K.L. Mattauch, T.W. Crowe and G. Green, "A Novel Whiskerless Schottkey Diode for Millimeter and Submillimeter Wave Applications," I.E.E.E. ATIT-S Int. Microwave Symp. Dig., pp. 607-610 (Jun. 1987).
Simon, Grab., Krozer, Beilenhoff, Hartnagel, "Planar thz Schottky Diode Based on a Quasi Vertical Diode Structure," Fourth International Symposium on Space Terahertz Technology, pp. 392-403. (1993).
Simon, Lin, Hartnagel, Zimmermann, Zimmermann, "Fabrication and Optimization of Planar Schottky Diodes," Eighth International Symposium on Space Terahertz Technology. Harvard University. (Mar. 1997).
J. Hesler, W. R. Hall, T. W. Crowe, R. M. Weikle, II, B. S Deaver, R. F. Bradley and S. K. Pan, "Fixed-tuned submillimeter wavelength waveguide mixers using planar Schottky-barrier diodes," IEEE Trans. Microwave Theory Tech., vol. 45, No. 5, pp. 653-658, May 1997.
P. Sobis, N. Wadefalk, A. Emrich and J. Stake, "A broadband, low noise, integrated 340 GHz Schotty diode receiver," IEEE Microwave and Wireless Comp. Lett. , vol. 22, No. 7, pp. 366-3-68, Jul. 2012.
A. Maestrini, et al., "A frequency-multiplied source with more than 1 mW of power across the 840-900 GHz band," IEEE Trans. Microwave Theory and Tech.,, vol. 7, No. 58, pp. 1925-1932, Jul. 2010.
G. Chattopadhyay, et al., "An all-solid-state broad-band frequency multiplier chain at 1500 GHz," IEEE Trans. Microwave Theory and Tech., vol. 52, No. 5, pp. 1538-1547, May 2004.
D. Porterfield, et al., "A high-power fixed-tuned millimeter-wave balanced frequency doubler," IEEE Trans. Microwave Theory Tech., vol. 47, No. 4, pp. 419-425, Apr. 1999.
N. Erickson, "High efficiency submillimeter frequency multipliers," IEEE MTT-S Internet Microwave Symp. Digest pp. 1301-1304, 1990.
W. Peatman and T. W. Crowe, "Design and fabrication of 0.5 micron GaAs Schottky barrier diodes for low-noise brahertz receiver applications" Int. J. Infrared and Millimeter Waves, vol. I I, No. 3, pp. 355-365, 1990.
W. Bishop, et al., "A micron-thickness, planar Schottky diode chip for terahertz applications with theoretical minimum parasitic capacitance," IEEE MIT-S Int. Microwave Symp. Digest, vol. 3, pp. 1305-1308, May 1990.
P. Siegel, R. P. Smith, M. Graidis and S. Martin, "A 25 THz GaAs monolithic membrane-diode mixer," IEEE Trans. Microwave Theory and Tech., vol. 47, No. 5, pp. 596-604, May 1999.
S. Martin, B. Nakamura, et al., "Fabrication of 200 to 2700 GHz multiploier devices using GaAs and metal membranes," IEEE MIT-S Internal. Microwave Symp. Digest, pp. 1641- 1644, 2001.
Z. Liu, et al. "Broadband 180 degree phase-shifters using integrated submillimeter-wave Schottky diodes," IEEE Trans. Microwave Theory and Tech,. vol. 53, No. 9, pp. 2949-2955,Sep. 2005.
I. Mehdi, M. Mazed, R. Dengler, A. Pease, M. Natzic and P. Siegel, "Planar GaAs Schottky diodes inlegrated with quartz substrate circuitry for wave guide subharmonic mixers at 215 GHz," IEEE MTT-S Internal. Microwave Symp. Digest, vol. 2, pp. 779-782, May 1994.
T. Crowe, W. W Bishop, D. Porterfield , J. Hester and R. Weikle, "Opening the teraherlz window with integrated diode circuits," IEEE Journ. Solid Stale Circuits, vol. 40, No. 10, pp. 2104-2110, Oct. 2005.
K. Bhaumik, B. Gelmont, R. J.Mauauch and M. Shur, "Series impedance of GaAs planar Schottky diodes operated to 500 GHz," IEEE Trans. Microwave Theory and Tech., vol. 40, No. 5, pp. 880-885, May 1992.
A. Tang and J. Stake, "Impact of eddy currents and crowding effects on high frequency losses in planar Schottky dodes," IEEE Trans. on Electron Devices, vol. 58, No. 10, pp. 3260-3269, Oct. 2011.
L. E. Dickens, "Spreading resistance as a function of frequency," IEEE Trans. Microwave Theory and Tech., vol. 15, No. 2 , pp. 101-109, 1967.
K. S. Champlin, "Cutoff frequency of submillimeter Schottky-barrier diodes," IEEE Trans. Microwave Theory and Tech., vol. 26, No. I, pp. 31-34, Jan. 1978.
Virginia Diodes, Inc., https://web.archive.org/web/20040610134527/http://vadiodes.com/ (2004).
U. Bhapkar and T. W. Crowe, "Analysis of the high frequency series impedance of GaAs Schottky diodes by finite difference technique," IEEE Trans. Microwave Theory and Tech., vol. 40, No. 5, pp. 886-894, May 1992.
T. J. Reck, et al., "Micromachined probes for submillimeter-wave on-wafer measurements—part II : RF design and characterization," IEEE Trans. Teraherlz Sci. And Tech., vol. I, No. 2, pp. 357-363, Nov. 2011.
M. F. Bauwen, et al., "Characterization of micromachined on-wafer probes for the 600-900 GHz waveguide band," IEEE Trans. Teraherlz Sci. and Tech., vol. 4, No. 4, pp. 527-529, Jul. 2014.
B. Gelmont, M. Shur and R. J. Mattauch, "Capacitance-voltagc characteristics of microwave Schottky diodes," IEEE Trans. Microwave Theory and Tech., vol. 39, No. 5, pp. 857-863, May 1991.
A. Y. Tang, et al. "Analytical extraction of a Schottky diode model from broadband s-parameters," IEEE Trans. Microwave Theory and Tech., vol. 61, No. 5, pp. 1870-1878, May 2013.
D. Rutledge, D. P. Nekirk and D. P. Kasilingam, "Integrated-Circuit Antennas," Infrared and Millimeter Waves, vol. I, pp. 1-90, 1983 (Abstract only located).
Schoenthal, " Integrated Diode Circuits for Greater than 1 THz," Ph.D. Dissertation, University of Virginia, Charlottesville, VA, Jan. 2003 (Abstract only located).
L. K. Siedel, et al. "Fabrication and Analysis of GaAs Schottky Barrier Diodes Fabricated on Thin Membranes for Terahertz Applications," International Journal of Infrared and Millimeter Waves, vol. 10, No. 7 (1989).

(56) References Cited

OTHER PUBLICATIONS

P. Wood, et al., "GaAs Schottky Diodes for THz Mixing Applications," Fourth International Symposium on Space Terahertz Technology (1993).
PCT International Report on Patentability and International Search Report, PCT/US2015/047590 (dated Jan. 2016).

* cited by examiner

Prior Art

Prior Art

Prior Art

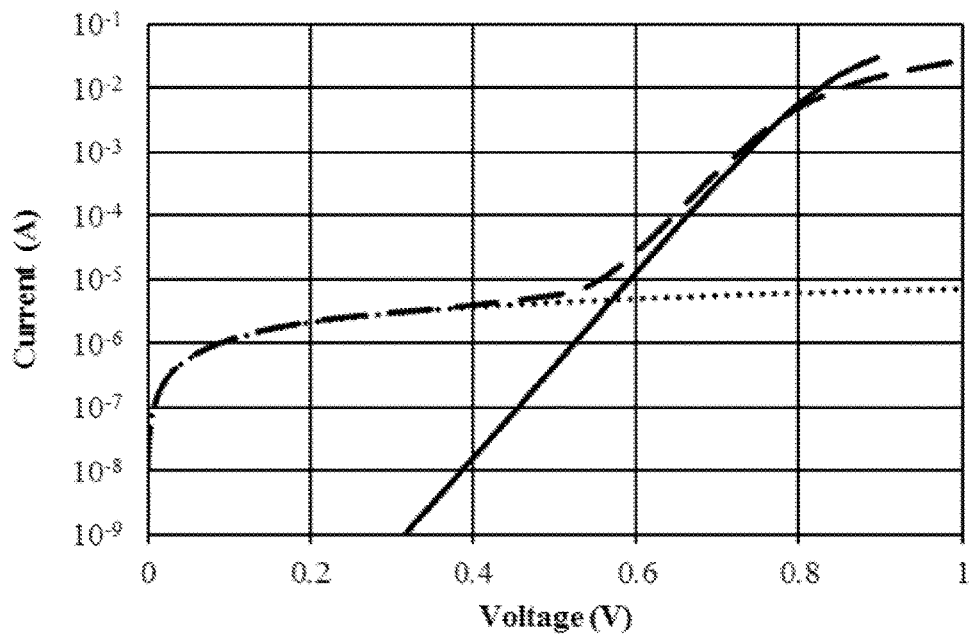
Fig. 8
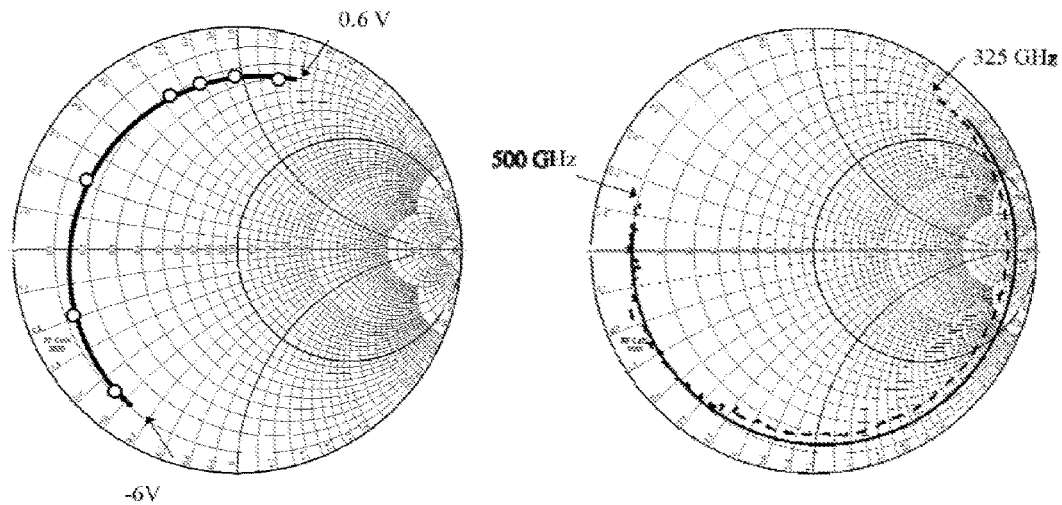
Fig. 9(a)                    Fig. 9(b)

QUASI-VERTICAL DIODE WITH INTEGRATED OHMIC CONTACT BASE AND RELATED METHOD THEREOF

CROSS-REFERENCE TO RELATED APPLICATIONS

This application claims the benefit of U.S. Provisional Application 62/043,772, filed on Aug. 29, 2014, which is incorporated herein by reference in its entirety.

BACKGROUND OF THE INVENTION

1. Field of the Invention

The present invention relates to a vertical diode geometry and method for fabricating the diode. More specifically, the invention relates to a vertical diode geometry with integrated bottomside ohmic contact that is bonded to a host substrate and a method for fabricating the diode.

2. Description of Related Art Including Information Disclosed Under 37 CFR §§ 1.97 and 1.98

Schottky diodes are critical and ubiquitous devices used for high-frequency electronics. These devices have been used for decades as detectors for measuring signal power level at millimeter and terahertz frequencies, as mixers in heterodyne receiver instruments, and as variable capacitors in frequency multipliers. Each of these components is a building block for the instrumentation used in radio astronomy, radar and imaging systems, as well as many other applications.

The success of the Schottky diode has largely been due to the development of processing methods that have allowed it to evolve from a vertically-oriented whisker-contacted device (that can be unreliable and is difficult to integrate into circuits) to a laterally-oriented planar device that is compatible with modern IC circuit design and processing. The ability to integrate the diode into planar circuitry allows the implementation of sophisticated circuit architectures that yield improved performance. In addition, the adoption of wafer-bonding methods that permit diodes to be attached to alternative substrate materials with superior mechanical strength and thermal properties has led to diode-based integrated circuits with unprecedented levels of performance. This approach to diode processing and design is the key technology behind the success of several recent start-up companies marketing millimeter and submillimeter-wave instruments.

While the advantage of laterally-oriented (planar) diodes lies in their compatibility with planar IC processing technology, the planar orientation results in a diode ohmic contact that is coplanar with the diode anode contact. This orientation requires current to travel parallel to the substrate surface and results in significant series resistance due to (1) the practical distance at which the ohmic contact can be fabricated, (2) skin effect and current crowding at the surface, and (3) trapping or other imperfections associated with the semiconductor-air interface. As a consequence, the intrinsic performance of planar devices has not exceeded that of the best vertical whisker contacted devices, which typically can exhibit significantly lower series resistances and parasitic capacitance.

Originally, submillimeter-wave Schottky diodes were realized using a wire whisker contacting the surface of a semiconducting substrate (such as GaAs, see FIG. 1(a)). This approach to fabricating diodes resulted in the highest-frequency and lowest-parasitic diodes ever realized. However, difficulties associated with the mechanical robustness of the whisker contact as well as integrating the device into sophisticated circuit architectures led to the development of a "planar" or lateral embodiment in which the diode contact was defined lithographically with anode and ohmic contact oriented parallel to the semiconductor substrate (FIG. 1(b)). Loss, fragility, and poor thermal properties of the semiconductor (GaAs) substrate led to the development of substrate replacement methods in which the diode material was bonded to a separate substrate with desirable properties (such as quartz). An example of this basic concept, shown in FIG. 1(c), is presently the approach used for commercial diode-based instruments.

Alternative diode architectures designed to improve the performance of the device while permitting compatibility with standard planar circuit layouts include the GaAs membrane diode developed at the Jet Propulsion Laboratory (FIG. 2) and the quasi-vertical diode concept explored by the Institut fir Hochfrequenztechnik, Technische Hochschule in Darmstadt, Germany (FIG. 3). The JPL approach has permitted realization of diode circuits to 2 THz and beyond, but the GaAs membrane is fragile and constitutes a poor thermal conductor. The quasi-vertical diode geometry from Darmstadt is an attempt to create a diode that combines the advantages of the whisker contacted diodes (low resistance and parasitics—see FIG. 4) and planar diodes (compatibility with IC fabrication and integration).

BRIEF SUMMARY OF THE INVENTION

It is an object of the present invention to provide a diode architecture that better controls the device parasitics and facilitates the device and circuit assembly relative to the prior art, and a method for fabricating such a diode architecture.

It is another object of the present invention to provide a diode architecture that provides lower series resistance compared to diodes that have coplanar anode and ohmic contacts.

One aspect of the present invention provides for, but is not limited to, an extension of the wafer-bonding approach that has been used for realizing laterally-oriented (planar) diodes bonded to various substrate materials, but extends the method by permitting a vertically-oriented diode structure to be realized. The resulting quasi-vertical device of the present invention provides the advantages of high performance of vertical whisker-contacted devices with the amenability of laterally-oriented planar devices to integration.

In another aspect of the present invention, a quasi-vertical diode is provided comprising a bottom ohmic contact that (1) can be placed in close proximity to the anode contact (2) allows current to flow through the bulk semiconducting material rather than along the surface, (3) can be bonded to a variety of substrate materials to address thermal grounding or loss issues and (4) remains compatible with integration into planar circuit architectures.

An aspect of an embodiment of the present invention provides for, but not limited thereto, an architecture and method for realizing a vertical diode geometry that is compatible with planar integrated circuit fabrication techniques. The diode may be fabricated from a semiconducting material (for example, GaAs) on which an ohmic contact has been manufactured on the bottom surface. The semiconducting material may be bonded to a host substrate (such as silicon or diamond) that supports the surrounding circuitry, with the bottom ohmic contact surface in contact with the host supporting substrate, thus forming a composite chip. The remaining anode contact and surrounding circuitry are subsequently fabricated on the composite chip, resulting in a vertically-oriented diode that is compatible with and capable of being integrated with a planar circuit.

BRIEF DESCRIPTION OF THE DRAWINGS

The invention is better understood by reading the following Detailed Description of the Preferred Embodiments with reference to the accompanying drawing figures, in which like reference numerals refer to like elements throughout, and in which:

FIG. 5(a) shows GaAs epitaxy, FIG. 5(b) shows semiconductor wafer bonding to the silicon substrate, FIG. 5(c) shows the mesa etch, and FIG. 5(d) shows the final anode and cathode contact formation.

FIG. 8 is a graph plotting the measured current-voltage characteristic of a quasi-vertical diode integrated onto high-resistivity silicon.

FIGS. 9(a) and 9(b) are graphs of the measured reflection coefficient of quasi-vertical diodes as a function of bias at 450 GHz and as a function frequency at −6 V bias voltage, respectively, wherein the solid lines are generated from the equivalent circuit of the diode model.

DETAILED DESCRIPTION OF THE INVENTION

Figure 1A:
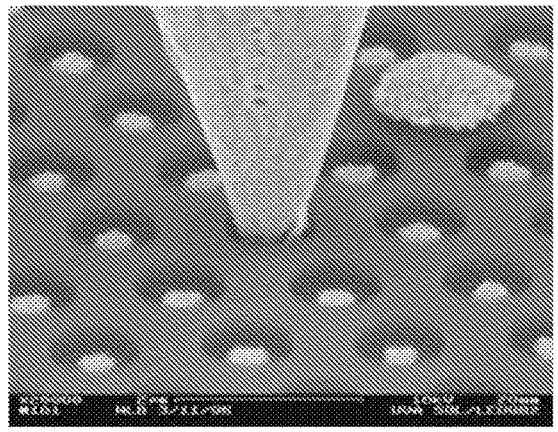
FIGS. 1(a), 1(b), and 1(c) respectively show the evolution of the Schottky diode from whisker-contacted vertical geometry, to planar lateral geometry, to planar lateral bonded to a support substrate.
Figure 1B:
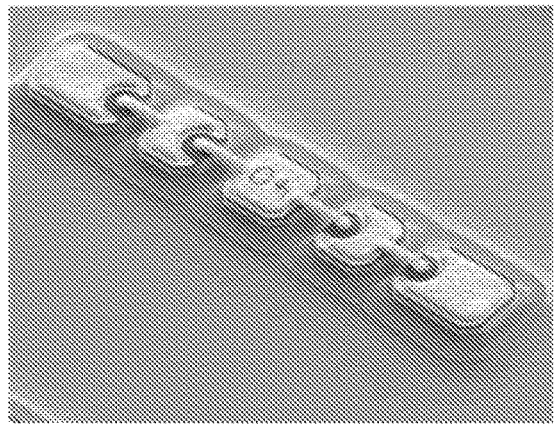
Figure 1C:
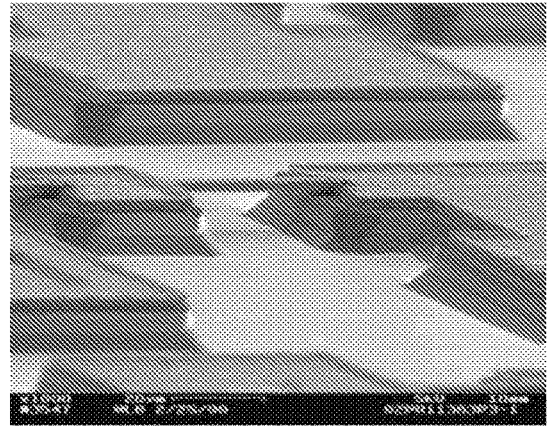
Figure 2:
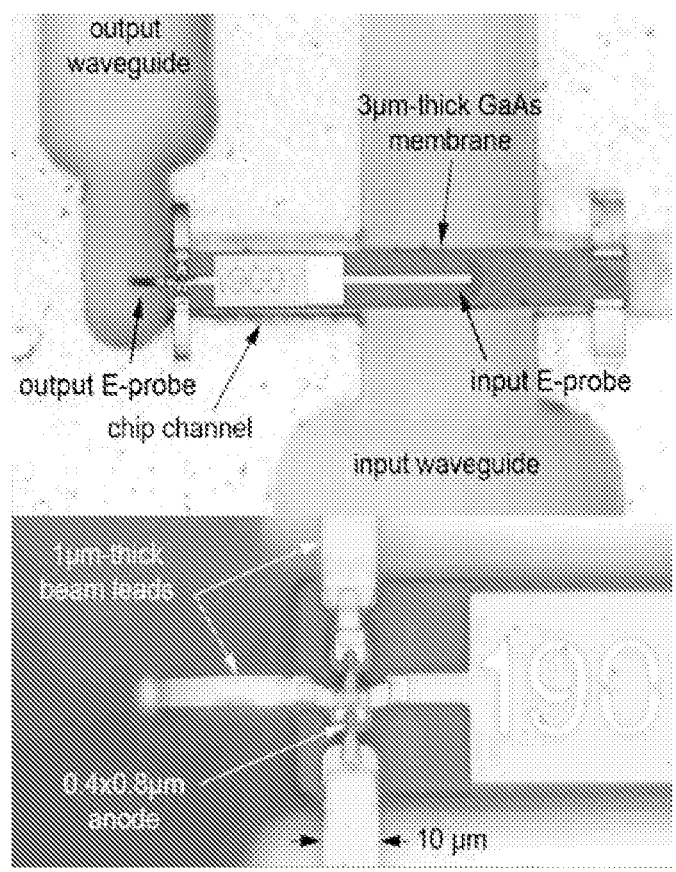
FIG. 2 is an illustration of a prior art GaAs membrane diode multiplier.

In describing preferred embodiments of the present invention illustrated in the drawings, specific terminology is employed for the sake of clarity. However, the invention is not intended to be limited to the specific terminology so selected, and it is to be understood that each specific element includes all technical equivalents that operate in a similar manner to accomplish a similar purpose.

The diode 100 in accordance with the present invention builds on the above-described prior art concepts by combining a number of novel ingredients that make it unique while displaying advantages compared with these previous diode embodiments.

A first embodiment of the present invention is directed to a vertical diode geometry 100 with integrated bottomside ohmic contact 140 that is bonded to a host substrate 160 and a method for fabricating the diode. In a more specific embodiment, the invention is directed to a quasi-vertical Schottky diode architecture 100 with bottom-side ohmic contact 140 that is bonded to a host circuit substrate 160 and a method for fabricating this device. As shown in FIGS. 5(a)-5(d), the geometry of the diode 100 includes, but is not limited to a topside anode contact 110 that connects to external circuitry through an airbridge finger 120, a thin (1 μm or less) mesa 130 of semiconductor material (e.g., GaAs) with appropriate epilayers for the diode application, including a bottomside highly-doped layer 132, a bottomside ohmic contact 140 that lies directly below the anode 110, a thin bonding layer 150 below the ohmic contact 140, and a host substrate 160 (such as high-resistivity silicon or diamond) onto which the diode material has been attached.

The bottom ohmic contact 140 is characterized in that it (1) can be placed in close proximity to the anode contact 110, (2) allows current to flow through the bulk semiconducting material rather than along the surface, (3) can be bonded to a variety of substrate materials to address thermal grounding or loss issues, and (4) remains compatible with integration into planar circuit architectures.

Thus, it will be appreciated by those of skill in the art that the quasi-vertical diode topology 100 includes an airbridge finger contact 120 to the anode 110, as does a planar diode topology. However, in contrast with a planar diode topology, ohmic contact 140 for the quasi-vertical diode 100 is formed on the back of a GaAs mesa 130, lies directly below the anode 110, and extends beyond the perimeter of the mesa 130. This arrangement permits electrical connection to the ohmic contact 140 using a metal overlay 170 rather than vias. It also provides the advantages of high performance of vertical whisker-contacted devices with the amenability of laterally-oriented planar devices to integration.

Figure 6A:
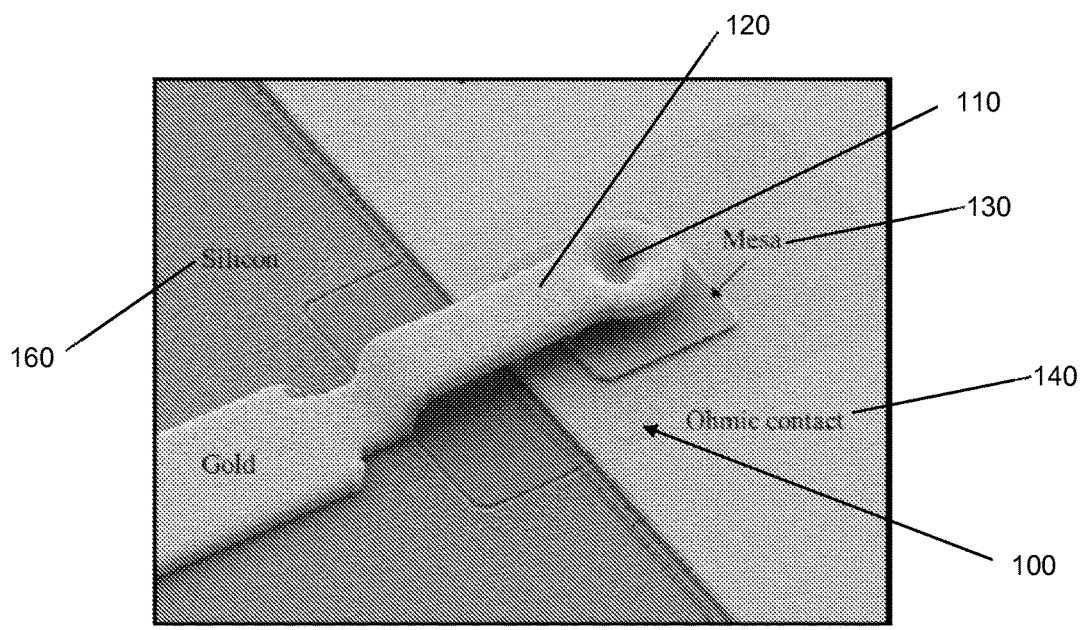
FIGS. 6(a) and 6(b) are scanning electron microscope ("SEM") images of a quasi-vertical diode with integrated ohmic contact base in accordance with the present invention.
Figure 6B:
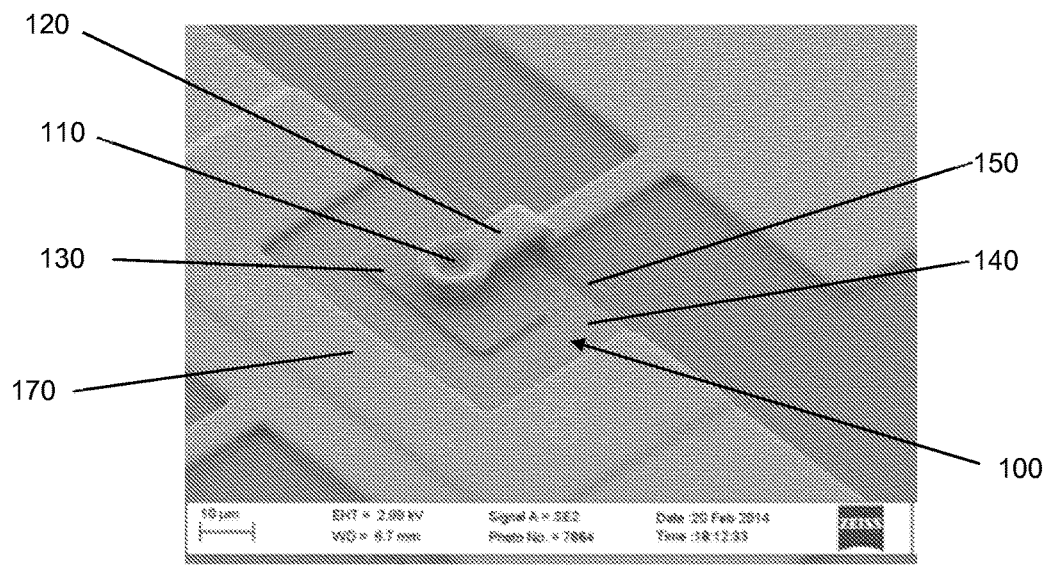
Figure 10:
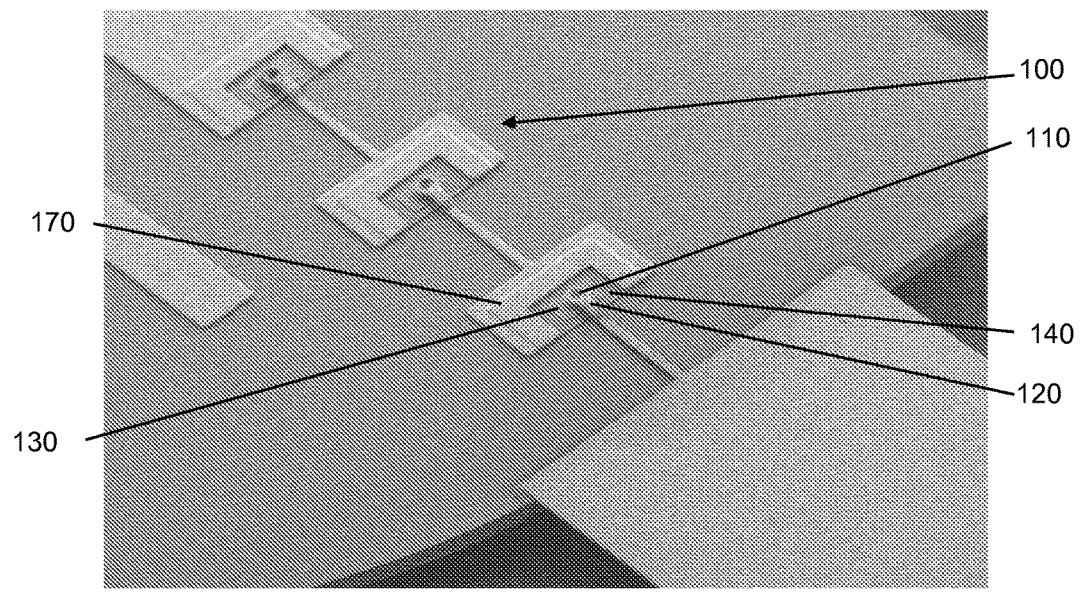
FIG. 10 is an SEM image of quasi-vertical diodes integrated into a planar circuit on a 15 μm thick high-resistivity silicon membrane, fabricated in accordance with the present invention.

FIGS. 6(a) and 6(b) detail the quasi-vertical diode geometry 100, showing SEM images of the anode contact region 110 including the GaAs mesa 130, underlying ohmic contact 140, metal overlay 170, and finger 120 bridging the anode 110. Through post-processing of the silicon host substrate 160, quasi-vertical diodes 100 integrated onto silicon membranes, as thin as a few microns, with integrated beamleads for chip support and electrical connection, can be readily created, as shown in FIG. 10 (an SEM image of an array of quasi-vertical diodes fabricated on a 15 μm thick high-resistivity silicon carrier with beamleads).

FIGS. 5(a)-5(d) show the basic fabrication process steps used to create the quasi-vertical diode 100 in accordance with the present invention. In its broadest aspect, a method for creating the diode 100 includes the following process steps: (1) preparation of a semiconductor wafer 200 for processing (including initial etching of material to expose a highly-doped (n++) epilayer, (2) deposition of metals and annealing to form the ohmic contact 140 on the bottom side of the semiconductor wafer 200 to create a diode wafer 300, (3) application of an adhesive bonding layer 150 (such as spin-on-glass) to the host substrate 160, (4) thermal compression bonding of the diode wafer 300 and host substrate wafer 160, with the ohmic contact side of the diode wafer 300 facing the host substrate wafer 160 to form a composite wafer 400, (5) etching and formation of diode mesas 130 to isolate devices on the host substrate 160, (6) lithography and formation of topside anode contact 110 and external circuitry on the host substrate wafer 160. The diode 100 shown in FIGS. 6(a) and 6(b) is an example of a diode fabricated in accordance with the method.

After completion of the diodes and circuitry, the host wafer 160 can be etched from the backside to form a thin (5-15 μm thick) membrane carrier chip with interconnects and beamleads protruding from the chip perimeter. This permits the completed diode integrated circuit to be seamlessly mounted into a housing or connected directly with other electrical components.

Figure 3A:
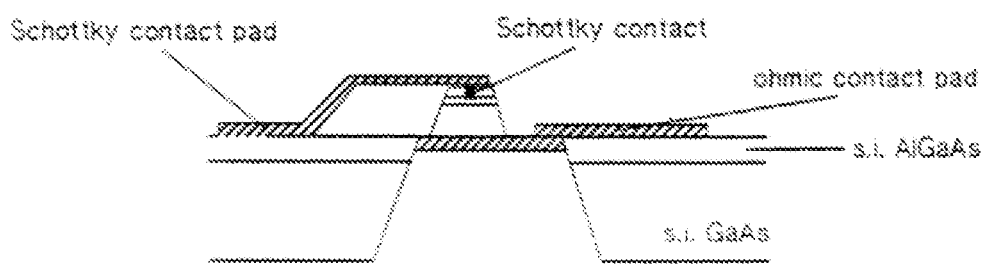
FIGS. 3(a) and 3(b) are illustrations of prior art vertical diodes.

A more detailed description of an exemplary method will now be set forth. Fabrication of the quasi-vertical diode starts with a semiconductor wafer 200 comprising an epitaxial stack-up of GaAs (n+/n) and AlGaAs on semi-insulating GaAs, as shown in FIG. 3(a). In a test of the method, a 650 μm semi-insulating substrate with 2 μm AlGaAs, 200 nm n-GaAs ($3 \times 10^{17}$ cm$^{-3}$), and 1 μm n+-GaAs ($5 \times 10^{18}$ cm$^{-3}$) epitaxial layers was used. Lithography on the top n+ layer defines the ohmic contact regions 140 which are formed from evaporated Ge/Pd/Au (30/40/50 nm) that are alloyed at 335° C. for 90 seconds and electroplated with 400 nm of gold to create the diode wafer 300. Measurements performed using ohmic contact transmission line structures formed near the wafer perimeter give a specific contact resistance of $5 \times 10^{-7}$ Ω·cm$^2$ for the devices so fabricated.

Figure 3B:
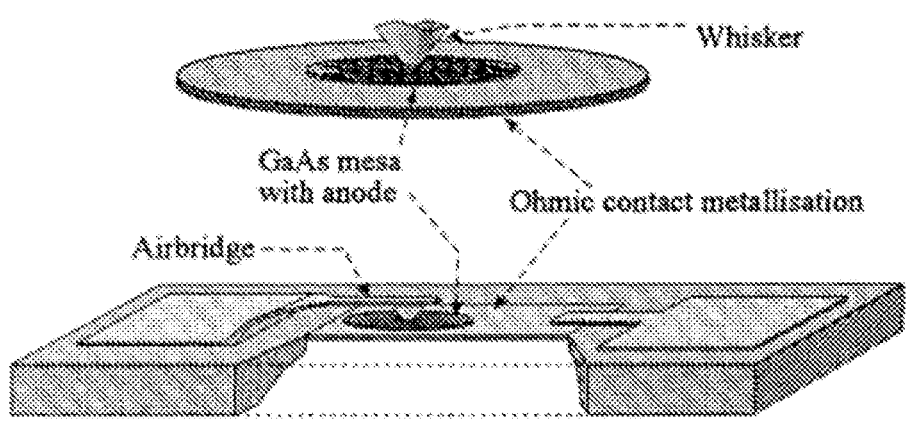

After formation of the ohmic contacts 140, the GaAs diode wafer 300 is bonded, ohmic-contact-side-down, to a high-resistivity (ρ>10 kΩ-cm) silicon wafer 160 using spin-on-glass (Filmtronics FG65) applied at 3000 rpm for 30 seconds to yield an adhesive layer 150 approximately 500 nm thick (FIG. 3(b)). The bonding process involves mounting the GaAs diode wafer 300 and silicon substrate 160 in a bonding press, pulling a vacuum in the chamber and bringing the diode wafer 300 and silicon substrate wafer 160 into contact. The press is then heated to 180° C. before cooling to room temperature, permanently joining the two wafers 300 and 160.

Once the diode wafer 300 is bonded to the silicon substrate 160, the semi-insulating GaAs is removed in citric acid and the 2 μm thick AlGaAs etch stop is removed in hydrofluoric acid, leaving an n–n+-ohmic metal stack-up on silicon. The final device mesas 130 are defined lithographically and all unneeded GaAs is removed with a second citric acid etch. Finally, residual spin-on-glass remaining on the exposed substrate is removed using reactive ion etching (FIG. 3(c)).

The final step in the process is formation of the anode 110, finger contact 120, ohmic contact overlay metallization 170, and other circuit features on the silicon surface. To define the diode finger 120 and other circuit features on the silicon surface, a sacrificial photoresist layer is patterned and titanium and gold (7/22 nm) are sputtered over this layer. A second layer of photoresist is spun over the sacrificial resist layer and patterned, and the areas of interest are then plated through this second photoresist mask. The Ti/Au seed layer and sacrificial resist are then removed as final step, leaving the finished device (FIG. 3(d)).

Figure 4:
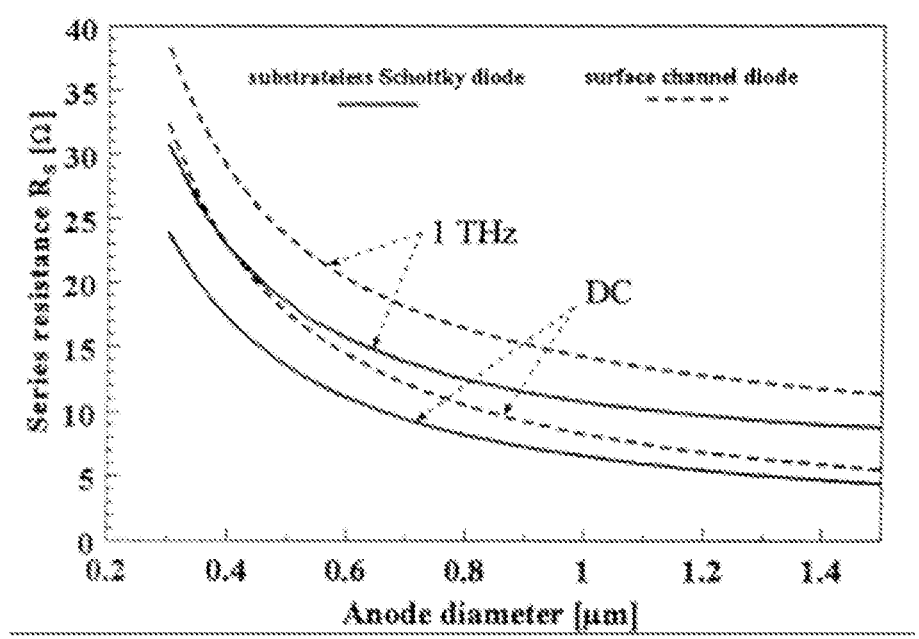
FIG. 4 is a graph plotting anode diameter versus series resistance for a quasi-vertical diode structure fabricated for characterization at submillimeter-wave frequencies.
Figure 5A:
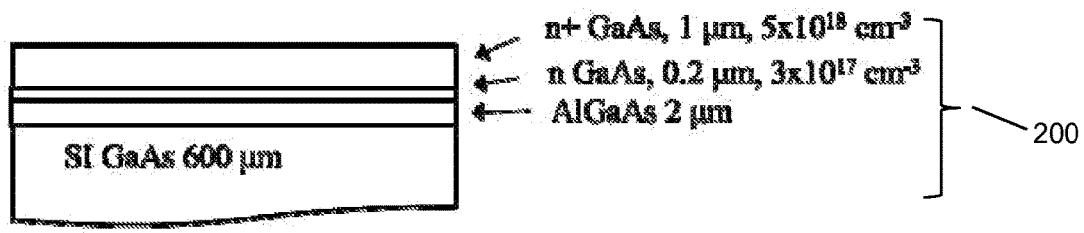
FIGS. 5(a)-5(d) show the geometry of a quasi-vertical diode with bottom side integrated ohmic contact base in accordance with the present invention, as well as the basic fabrication process steps used to create the quasi-vertical diode.
Figure 5B:
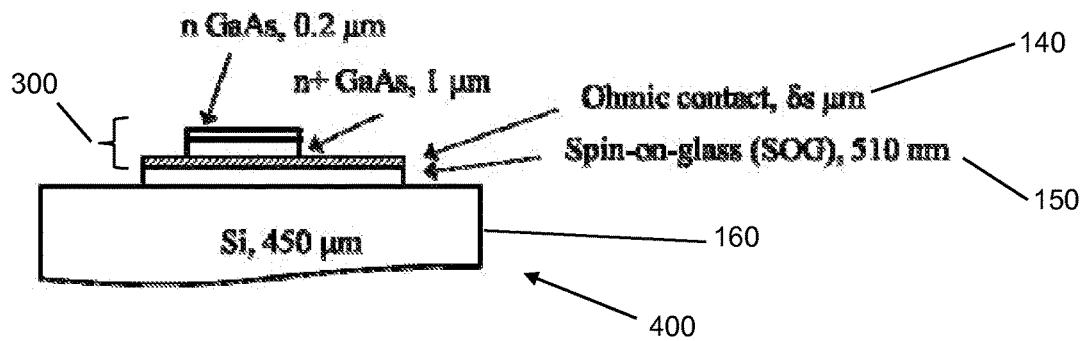
Figure 5C:
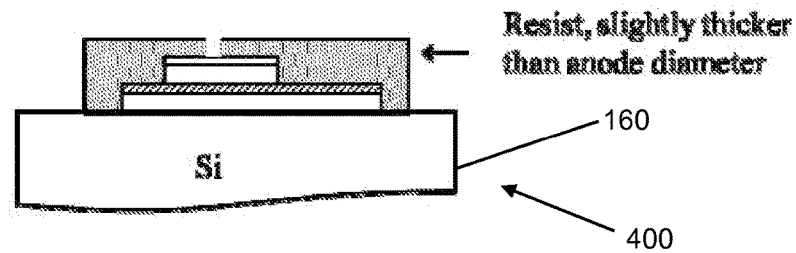
Figure 5D:
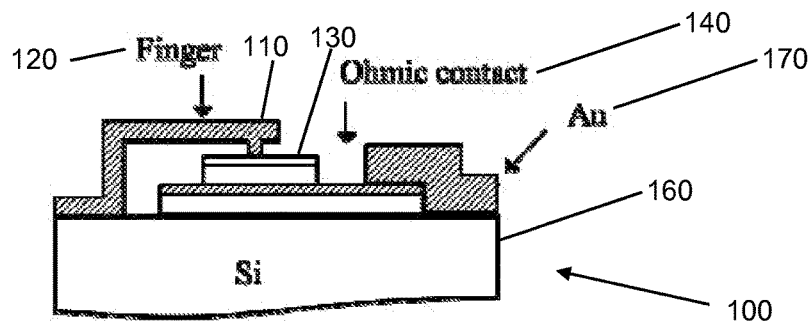

In contrast to the method used to fabricate the ohmic contacts of planar-oriented diodes, in the method of fabricating quasi-vertical diode geometry in accordance with the present invention, the mesa 130 is wafer-bonded to the host silicon substrate 160. The diode ohmic contact 140 is formed prior to transfer of the epitaxy to the host silicon, and GaAs is not relied upon for structural integrity, resulting in a vertical diode supported by a mechanically-robust substrate 160. As shown in FIG. 4, the finger contact 120 to the anode 110 is an airbridge suspended several microns above the silicon substrate 160 and ohmic contact 140.

To assess the diode performance as a millimeter and submillimeter-wave device, a number of quasi-vertical structures with coplanar waveguide (CPW) feeds were processed for measurement, including diodes with nominal anode diameters of 3 μm, 2.4 μm, and 1.8 μm. Test structures consisting of single diodes having a geometry as shown in FIG. 4, as well as diodes with different lengths of shunt tuning stub, were fabricated for on-wafer characterization in the 325-750 GHz range.

Figure 7:
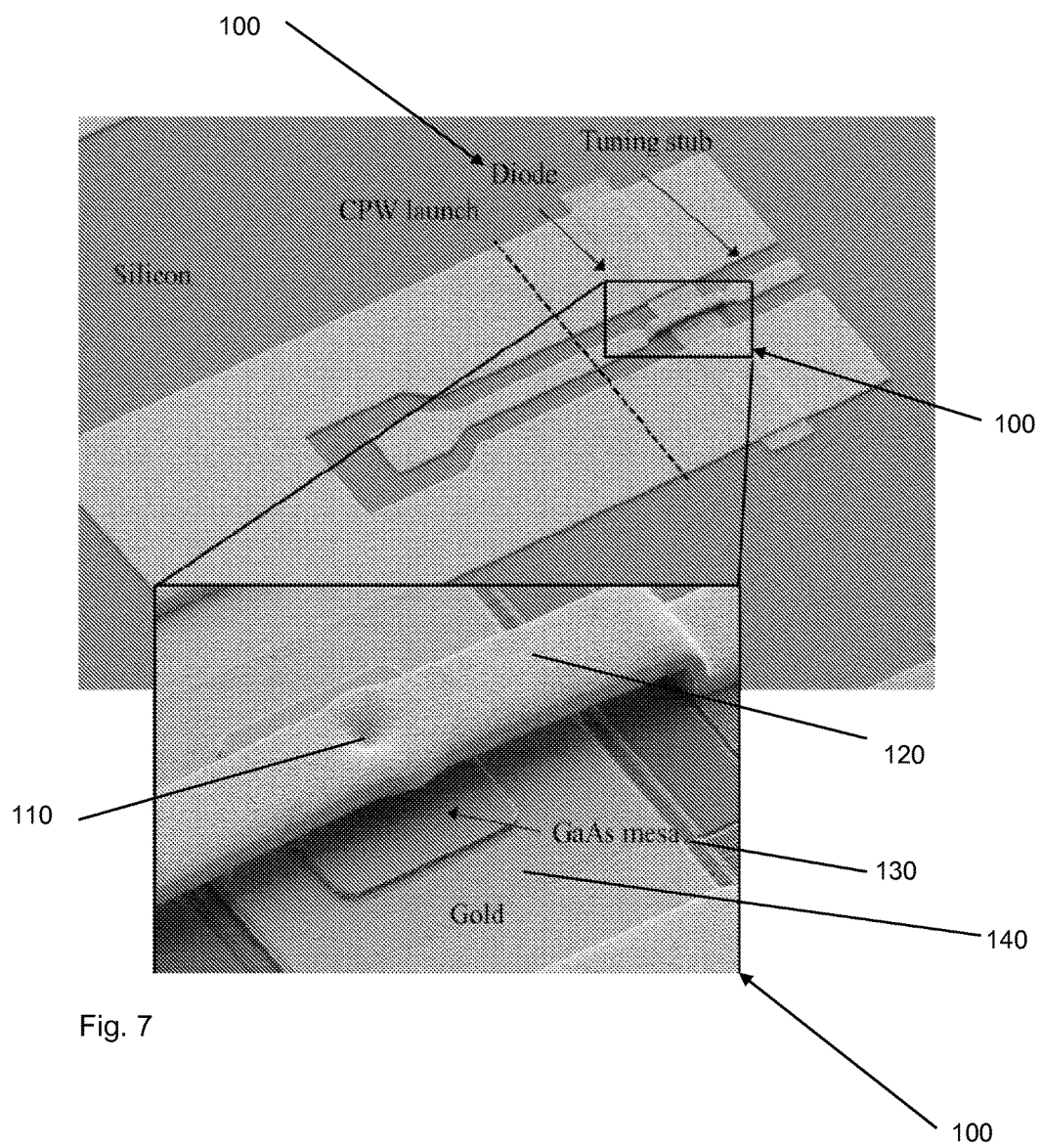
FIG. 7 is an illustration of a quasi-vertical diode structure fabricated for characterization at submillimeter-wave frequencies, in accordance with the present invention.

FIG. 7 is an SEM image of an exemplary quasi-vertical diode 100 in accordance with the present invention, fabricated for DC and RF characterization. FIGS. 8 and 9 show the DC current-voltage relation of the diode and the RF impedance measured with on-wafer probes in the 325-500 GHz range, according to the measurement method described in Chapter 3 of Alijabbari, N. (2014), "Submillimeter-Wave Quasi-Vertical GaAs Schottky Diodes Integrated on Silicon Membranes" (Retrieved from http://libra.virginia.edu/catalog/libraoa: 7744).

Various embodiments of the present invention may provide a number of novel and nonobvious features, elements and characteristics. Among the aspects of the invention believed to be novel and nonobvious is that the ohmic contact 140 of the device 100 lies directly below the anode contact 110 and is bonded to a supporting host substrate 160 on which all surrounding circuitry is fabricated. This permits realization of a vertical diode that can be integrated with planar circuits as well as devices fabricated from other materials (such as silicon or diamond). This is distinct from previous wafer-bonded diodes (which are laterally oriented) or quasi-vertical diodes (which do not employ a host substrate). The host substrate 160 can be chosen to provide superior mechanical strength (e.g., silicon) compared to the III-V semiconductor diode material or better thermal grounding (e.g. diamond or Aluminum Nitride). The diode-host substrate composite wafer can also be subjected to additional processing to realize a membrane carrier with beamlead extensions. For example, FIG. 10 shows a completed array of quasi-vertical diodes 100 on a thin 15 μm thick high-resistivity silicon carrier with beamlead.

The present invention has a number of advantages over the current planar diode geometry that is widely employed for millimeter and submillimeter-wave circuits. The quasi-vertical device provides the advantages of high performance associated with vertical whisker-contacted devices with the amenability of laterally-oriented planar devices to integration. The characteristics of the bottom ohmic contact 140 (that it (1) can be placed in close proximity to the anode contact 110, (2) allows current to flow through the bulk semiconducting material rather than along the surface, (3) can be bonded to a variety of substrate materials to address thermal grounding or loss issues and (4) remains compatible with integration into planar circuit architectures) allows the realization of fully integrated circuit architectures separately mounting of diodes as well as the use of a wide variety of host substrate materials that can be selected according to application. In preliminary experiments with these diodes, the present inventors have demonstrated good performance to 1 THz and have used them as the basis of two frequency multiplier designs in the millimeter-wave spectrum, which are described in the inventors' co-pending U.S. patent application Ser. No. 15/507,637, which claims the benefit of U.S. Provisional Application No. 62/043,698, filed Aug. 29, 2014, and in Alijabbari, N. (2014), "Submillimeter-Wave Quasi-Vertical GaAs Schottky Diodes Integrated on Silicon Membranes" (Retrieved from http://libra.virginia.edu/catalog/libraoa: 7744), all of which are incorporated herein by reference in their entireties. Both of these multipliers have shown superior RF and thermal performance compared to similar circuits constructed from planar diodes.

An aspect of various embodiments of the present invention may be utilized for a number of products and services. A number of companies in the RF/millimeter-wave/terahertz field utilize Schottky diodes for instrumentation that they market and sell. Examples of such instruments are diode-based detectors, mixers, and multipliers that are the basis of any transmit/receive module employed in spectrum analyzers, network analyzers, heterodyne receivers, spectrometers and other related instruments. Among the companies currently developing these devices and instruments are Virginia Diodes, Inc., Oleson Microwave, Inc., Aeroflex/Metellics, Millitech, Agilent, Anristsu, and Rhode & Schwarz.

PUBLICATIONS

The following patents, applications and publications as listed below and throughout this document are hereby incorporated by reference in their entireties herein (and which are not admitted to be prior art with respect to the present invention by inclusion in this section).

Alijabbari, N. (2014). Submillimeter-Wave Quasi-Vertical GaAs Schottky Diodes Integrated on Silicon Membranes. Retrieved from http://libra.virginia.edu/catalog/libraoa:7744.

W. L. Bishop, K Mckinney, K L. Mattauch, T. W. Crowe and G. Green, "A novel whiskerless Schottky diode for millimeter and submillimeter wave applications," IEEE ATTT-S Int. Microwave Symp. Dig., June 1987, pp 607-610

Simon, A. Grab, V. Krozer. K. Beilenhoff. H. L. Hartnagel, "Planar thz schottky diode based on a quasi vertical diode structure," Fourth International Symposium on Space Terahertz Technology, pp. 392-403

Simon, C. I. Lin, H. L. Hartnagel P. Zimmermann, R Zimmermann, "Fabrication and optimisation of planar schottky diodes" Eighth International Symposium on Space Terahertz Technology. Harvard University, March 1997.

ADDITIONAL REFERENCES

The devices, systems, compositions, and computer readable medium, and methods of various embodiments of the invention disclosed herein may utilize aspects disclosed in the following references, applications, publications and patents and which are hereby incorporated by reference herein in their entireties (and which are not admitted to be prior art with respect to the present invention by inclusion in this section):

U.S. patent application Ser. No. 13/699,255 entitled "MICROMACHINED ON-WAFER PROBES AND RELATED METHOD," filed Nov. 20, 2012; U.S. Patent Application Publication No. 2013/0106456, May 2, 2013.

International Patent Application No. PCT/US2011/037473, entitled "MICROMACHINED ON-WAFER PROBES AND RELATED METHOD," filed May 20, 2011.

U.S. patent application Ser. No. 09/988,203 entitled "INTEGRATION OF HOLLOW WAVEGUIDES, CHANNELS AND HORNS BY LITHOGRAPHIC AND ETCHING TECHNIQUES," filed Nov. 19, 2001.

U.S. patent application Ser. No. 09/381,744 entitled "Integration of Hollow Waveguides, Channels and Horns by Lithographic and Etching Techniques," filed Apr. 6, 2000.

International Patent Application No. US98/05828, entitled "INTEGRATION OF HOLLOW WAVEGUIDES, CHANNELS AND HORNS BY LITHOGRAPHIC AND ETCHING TECHNIQUES," filed Mar. 25, 1998.

International Patent Application No. PCT/US1998/05830, entitled "METHOD OF FABRICATING A MILLIMETER OR SUBMILLIMETER WAVELENGTH COMPONENT," filed Mar. 25, 1998.

U.S. patent application Ser. No. 09/381,746 entitled "Preferential Crystal Etching Technique for the Fabrication of Millimeter and Submillimeter Wavelength Horn Antennas," filed Mar. 25, 1998.

International Patent Application No. US98/05831, entitled "A PREFERENTIAL CRYSTAL ETCHING TECHNIQUE FOR THE FABRICATION OF MILLIMETER AND SUBMILLIMETER WAVELENGTH HORN ANTENNAS," filed Mar. 25, 1998.

Modifications and variations of the above-described embodiments of the present invention are possible, as appreciated by those skilled in the art in light of the above teachings. It is therefore to be understood that, within the scope of the appended claims and their equivalents, the invention may be practiced otherwise than as specifically described.

What is claimed is:

1. A quasi-vertical Schottky diode architecture comprising:
   a topside anode contact;
   an airbridge finger for connecting the topside anode to external circuitry;
   a thin mesa of semiconductor material, the mesa having epilayers including a bottomside highly-doped layer; and
   a bottomside ohmic contact formed on the back of the mesa and lying directly below the anode, wherein the bottomside ohmic contact extends beyond the perimeter of the mesa and provides an ohmic contact surface, and
   a host supporting substrate with a host supporting surface onto which the bottomside ohmic contact is bonded, the ohmic contact surface being fully in contact with the host supporting surface; and
   a thin bonding layer below the ohmic contact for bonding the ohmic contact surface to the host supporting surface.

2. The diode architecture of claim 1, wherein the host supporting substrate is solid in the region where the bottomside ohmic contact surface is bonded to the host supporting surface.

3. The diode architecture of claim 1, wherein the mesa is a GaAs mesa having a thickness less than or equal to 1 μm.

4. The diode architecture of claim 1, wherein the host substrate has a resistivity greater than 10 kΩ-cm, and the topside anode contact and the bottomside ohmic contact have contact pads lying directly on the host substrate.

5. The diode architecture of claim 1, wherein the airbridge finger is suspended above the host substrate and the bottomside ohmic contact.

6. A method of fabricating a diode architecture from a semiconductor wafer having a bottomside highly-doped epilayer, comprising the steps of:
   preparing the semiconductor wafer for processing, wherein the preparing includes initial etching of the wafer to expose the bottomside highly-doped epilayer;
   forming the bottomside ohmic contact with an ohmic contact surface on the semiconductor wafer by depositing metals on the top layer of the semiconductor wafer and annealing;

applying an adhesive layer to a surface of a host supporting substrate, the host substrate being solid in the region of the bottomside ohmic contact so as to receive the adhesive layer;
   bonding the semiconductor wafer and the host substrate by thermal compression, with the ohmic contact surface facing the host supporting surface and being bonded to the supporting substrate to form a composite wafer;
etching and forming of the mesa to isolate devices on the host substrate of the composite wafer; and
   lithographing and forming of the topside anode contact, the airbridge finger, and ohmic contact overlay metallization on the host substrate of the composite wafer.

7. The method of claim 6, wherein in the preparing step, the semiconductor wafer comprises an epitaxial stack-up of GaAs (n+/n) and AlGaAs on semi-insulating GaAs.

8. The method of claim 6, wherein the step of applying an adhesive layer includes applying spin-on glass to the host substrate.

9. The method of claim 6, wherein the step of bonding includes mounting the semiconductor wafer having the bottomside ohmic contact formed thereon and the host substrate in a bonding press, bringing the semiconductor wafer having the bottomside ohmic contact formed thereon and the host substrate into contact in a vacuum, and applying thermal compression thereto.

* * * * *